US009076829B2

(12) United States Patent
Brodine et al.

(10) Patent No.: US 9,076,829 B2
(45) Date of Patent: Jul. 7, 2015

(54) ROBOT SYSTEMS, APPARATUS, AND METHODS ADAPTED TO TRANSPORT SUBSTRATES IN ELECTRONIC DEVICE MANUFACTURING

(75) Inventors: Jeffrey A. Brodine, Los Gatos, CA (US); Jeffrey C. Hudgens, San Francisco, CA (US); Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 696 days.

(21) Appl. No.: 13/205,116

(22) Filed: Aug. 8, 2011

(65) Prior Publication Data
US 2013/0039726 A1 Feb. 14, 2013

(51) Int. Cl.
*B25J 9/04* (2006.01)
*H01L 21/677* (2006.01)

(52) U.S. Cl.
CPC .......... *H01L 21/67742* (2013.01); *B25J 9/041* (2013.01); *B25J 9/04* (2013.01); *H01L 21/67766* (2013.01); *B25J 9/042* (2013.01)

(58) Field of Classification Search
CPC .............. B25J 9/04; B25J 9/041; B25J 9/042; B25J 9/046; B25J 9/047; B25J 9/1055; B25J 9/12; B25J 9/123; B25J 9/126; B25J 9/14; B25J 9/142; B25J 9/144; B25J 9/146; B25J 11/0095; B25J 15/0014; B25J 17/025; B25J 17/0258; B25J 18/02; B25J 18/025; B25J 18/04; H01L 21/677; H01L 21/67703; H01L 21/67721; H01L 21/67739; H01L 21/37742; H01L 21/67766; H01L 2221/67; H01L 2221/683; Y10S 901/16; Y10S 901/17; Y10S 901/23

USPC .............. 74/490.02, 490.03, 490.05, 490.06; 414/226.5, 744.3, 744.5, 744.7, 806, 414/918, 935, 941; 901/16, 17, 23
See application file for complete search history.

(56) References Cited

U.S. PATENT DOCUMENTS 5,064,340 A * 11/1991 Genov et al. ................ 414/744.5
5,741,113 A * 4/1998 Bacchi et al. ............... 414/744.5
5,765,444 A * 6/1998 Bacchi et al. ............... 74/490.03
(Continued)

FOREIGN PATENT DOCUMENTS

WO WO 2010/080983 A2 7/2010

OTHER PUBLICATIONS

International Preliminary Report on Patentability and Written Opinion of International Application No. PCT/US12/048585 mailed Feb. 20, 2014.
(Continued)

*Primary Examiner* — Saul Rodriguez
*Assistant Examiner* — Brendan Tighe
(74) *Attorney, Agent, or Firm* — Dugan & Dugan, PC

(57) ABSTRACT

Substrate transport systems, apparatus, and methods are described. The systems are adapted to efficiently put or pick substrates at a destination by rotating a boom linkage to a position adjacent to the destination and then independently actuating an upper arm link housing and one or more wrist members to put or pick one or more substrates at the destination wherein the wrist member is independently actuated relative to the forearm link housing and the motion of the forearm link member is kinematically linked to the motion of the upper arm link housing. Numerous other aspects are provided.

14 Claims, 12 Drawing Sheets

(56) References Cited

U.S. PATENT DOCUMENTS

| | | | |
|---|---|---|---|
| 5,811,951 A | 9/1998 | Young | |
| 5,944,476 A * | 8/1999 | Bacchi et al. | 414/783 |
| 5,993,141 A | 11/1999 | Wytman | |
| 6,037,733 A | 3/2000 | Genov et al. | |
| 6,098,484 A * | 8/2000 | Bacchi et al. | 74/490.03 |
| 6,105,454 A | 8/2000 | Bacchi et al. | |
| 6,121,743 A | 9/2000 | Genov et al. | |
| 6,126,381 A * | 10/2000 | Bacchi et al. | 414/754 |
| 6,155,768 A * | 12/2000 | Bacchi et al. | 414/416.03 |
| 6,275,748 B1 * | 8/2001 | Bacchi et al. | 700/275 |
| 6,297,611 B1 | 10/2001 | Todorov et al. | |
| 6,360,144 B1 * | 3/2002 | Bacchi et al. | 700/250 |
| 6,366,830 B2 * | 4/2002 | Bacchi et al. | 700/250 |
| 6,400,115 B1 * | 6/2002 | Yamazoe | 318/568.11 |
| 6,453,214 B1 * | 9/2002 | Bacchi et al. | 700/245 |
| 6,481,956 B1 | 11/2002 | Hofmeister | |
| 6,514,032 B1 * | 2/2003 | Saino et al. | 414/744.1 |
| 6,593,718 B1 * | 7/2003 | Yamazoe | 318/568.11 |
| 6,632,065 B1 | 10/2003 | Cameron et al. | |
| 6,709,521 B1 * | 3/2004 | Hiroki | 118/719 |
| 6,737,826 B2 * | 5/2004 | Gilchrist | 318/568.21 |
| 6,893,204 B1 * | 5/2005 | Suzuki et al. | 414/744.5 |
| 7,039,498 B2 * | 5/2006 | Bacchi et al. | 700/245 |
| 7,179,044 B2 | 2/2007 | Cameron et al. | |
| 7,336,012 B2 | 2/2008 | Tanaka | |
| 7,383,751 B2 * | 6/2008 | Hashimoto et al. | 74/490.01 |
| 7,578,649 B2 * | 8/2009 | Caveney et al. | 414/744.5 |
| 7,585,686 B2 | 9/2009 | Verhaverbeke et al. | |
| 8,136,422 B2 * | 3/2012 | Kitahara et al. | 74/490.1 |
| 8,371,795 B2 * | 2/2013 | Kitahara et al. | 414/416.03 |
| 2001/0020199 A1 * | 9/2001 | Bacchi et al. | 700/245 |
| 2003/0202865 A1 | 10/2003 | Ponnekanti et al. | |
| 2005/0011294 A1 * | 1/2005 | Hashimoto et al. | 74/490.01 |
| 2005/0079042 A1 * | 4/2005 | Maeda | 414/744.2 |
| 2007/0020082 A1 * | 1/2007 | Caveney et al. | 414/744.5 |
| 2009/0024241 A1 | 1/2009 | Rice et al. | |
| 2009/0095111 A1 * | 4/2009 | Kitahara et al. | 74/490.05 |
| 2009/0182454 A1 | 7/2009 | Donoso et al. | |
| 2010/0019431 A1 | 1/2010 | Macleod et al. | |
| 2010/0150688 A1 * | 6/2010 | Kitahara et al. | 414/226.02 |
| 2010/0178146 A1 | 7/2010 | Kremerman et al. | |
| 2011/0135437 A1 | 6/2011 | Takeshita et al. | |
| 2013/0041505 A1 * | 2/2013 | Cox et al. | 700/254 |
| 2013/0149076 A1 * | 6/2013 | Cox et al. | 414/217 |

OTHER PUBLICATIONS

International Search Report and Written Opinion of International Application No. PCT/US12/048585 mailed Feb. 5, 2013.

Cox et al., U.S. Appl. No. 13/205,123, filed Aug. 8, 2011.

\* cited by examiner

ROBOT SYSTEMS, APPARATUS, AND METHODS ADAPTED TO TRANSPORT SUBSTRATES IN ELECTRONIC DEVICE MANUFACTURING

FIELD OF THE INVENTION

The present invention relates to electronic device manufacturing, and more specifically to systems, apparatus, and methods adapted to transport substrates.

BACKGROUND OF THE INVENTION

Conventional electronic device manufacturing systems may include multiple process chambers and load lock chambers. Such chambers may be included in cluster tools where a plurality of process chambers may be disbursed about a transfer chamber, for example. These systems and tools may employ transfer robots that may be housed within the transfer chamber to transport substrates between the various process chambers and load locks. For example, the transfer robot may transport a substrate from chamber to chamber, from load lock to chamber, and/or from chamber to load lock. Efficient and precise transport of substrates between the various system chambers may be important to system throughput, thereby lowering overall operating costs. Furthermore, reduced system size is sought after because distances that the substrates need to move is reduced as are material costs.

Accordingly, improved systems, apparatus, and methods for efficient and precise movement of substrates, such as in transfer chambers, are desired.

SUMMARY OF THE INVENTION

In one aspect an electronic device processing system is provided. The system includes a chamber, a robot apparatus received in the chamber and adapted to transport a substrate, the robot apparatus including a boom linkage adapted to rotate about a first rotational axis, an upper arm link housing coupled to the boom linkage at a first radial position offset from the first rotational axis, the upper arm link housing adapted to rotate about a second rotational axis at the first radial position, a forearm link housing coupled to the upper arm link housing at a second position spaced from the second rotational axis, and adapted for rotation relative to the upper arm link housing about a third rotational axis at the second position, a wrist member coupled to, and adapted for rotation relative to the forearm link housing about a fourth rotational axis, the wrist member adapted to couple to an end effector, wherein the end effector is adapted to carry a substrate, and a forearm drive member rigidly coupled to the boom linkage and having a forearm driving element extending through the upper arm link housing, the forearm driving element coupled to a driven member of the forearm link housing.

In another aspect a robot apparatus adapted to move substrates within an electronic device processing system is provided. The robot apparatus includes a boom linkage adapted to rotate about a first rotational axis, an upper arm link housing coupled to the boom linkage at a first radial position offset from the first rotational axis, the upper arm link housing adapted to rotate about a second rotational axis at the first radial position, a forearm link housing coupled to the upper arm link housing at a second position spaced from the second rotational axis, and adapted for rotation relative to the upper arm about a third rotational axis at the second position, a wrist member coupled to, and adapted for rotation relative to the forearm link housing about a fourth rotational axis, the wrist member adapted to couple to an end effector, wherein the end effector is adapted to carry a substrate, and a forearm drive member rigidly coupled to the boom linkage and having a forearm driving element extending through the upper arm link housing, the forearm driving element coupled to a driven member of the forearm link housing.

In another aspect, a method of transporting a substrate within an electronic device processing system is provided. The method includes providing a robot apparatus having a boom linkage, an upper arm link housing coupled to the boom linkage, a forearm link housing coupled to the upper arm link housing, and a wrist member coupled to the forearm link housing, the wrist member adapted to couple to an end effector, and a forearm drive member rigidly coupled to the boom linkage and having a forearm driving element extending through the upper arm link housing, the forearm driving element coupled to a driven member of the forearm link housing, rotating the boom linkage to a location adjacent to a pick or place location, independently rotating the upper arm link housing relative to the boom linkage, and independently rotating the wrist member relative to the forearm link housing.

Numerous other features are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIG. 2I is a cross sectioned side view of an embodiment of a robot apparatus.

DETAILED DESCRIPTION

Figure 1:
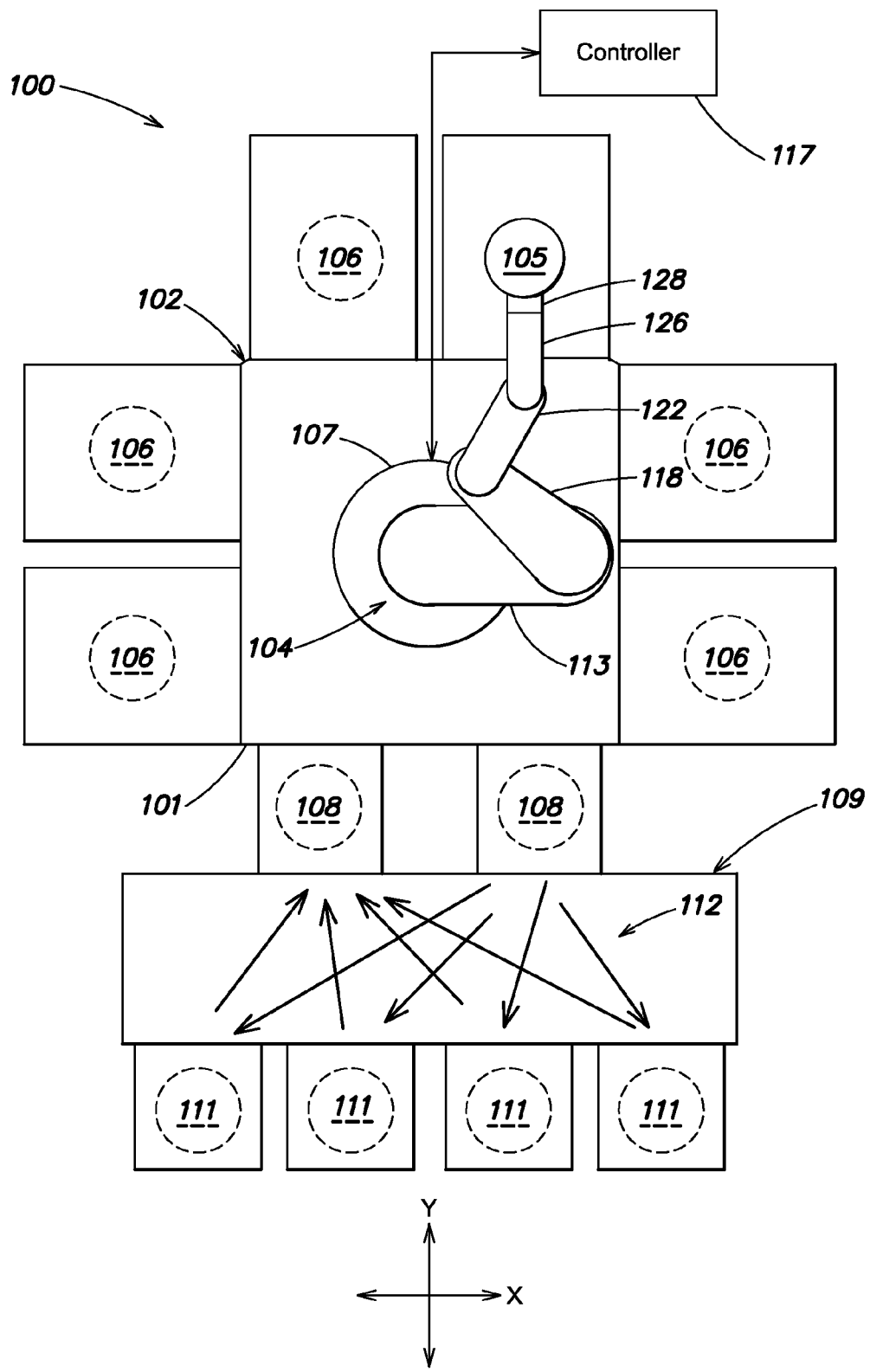
FIG. 1 is a schematic top view of a substrate processing system including a robot apparatus located in a transfer chamber of a main frame adapted to transport substrates between process chambers and/or load locks according to embodiments.
Figure 2A:
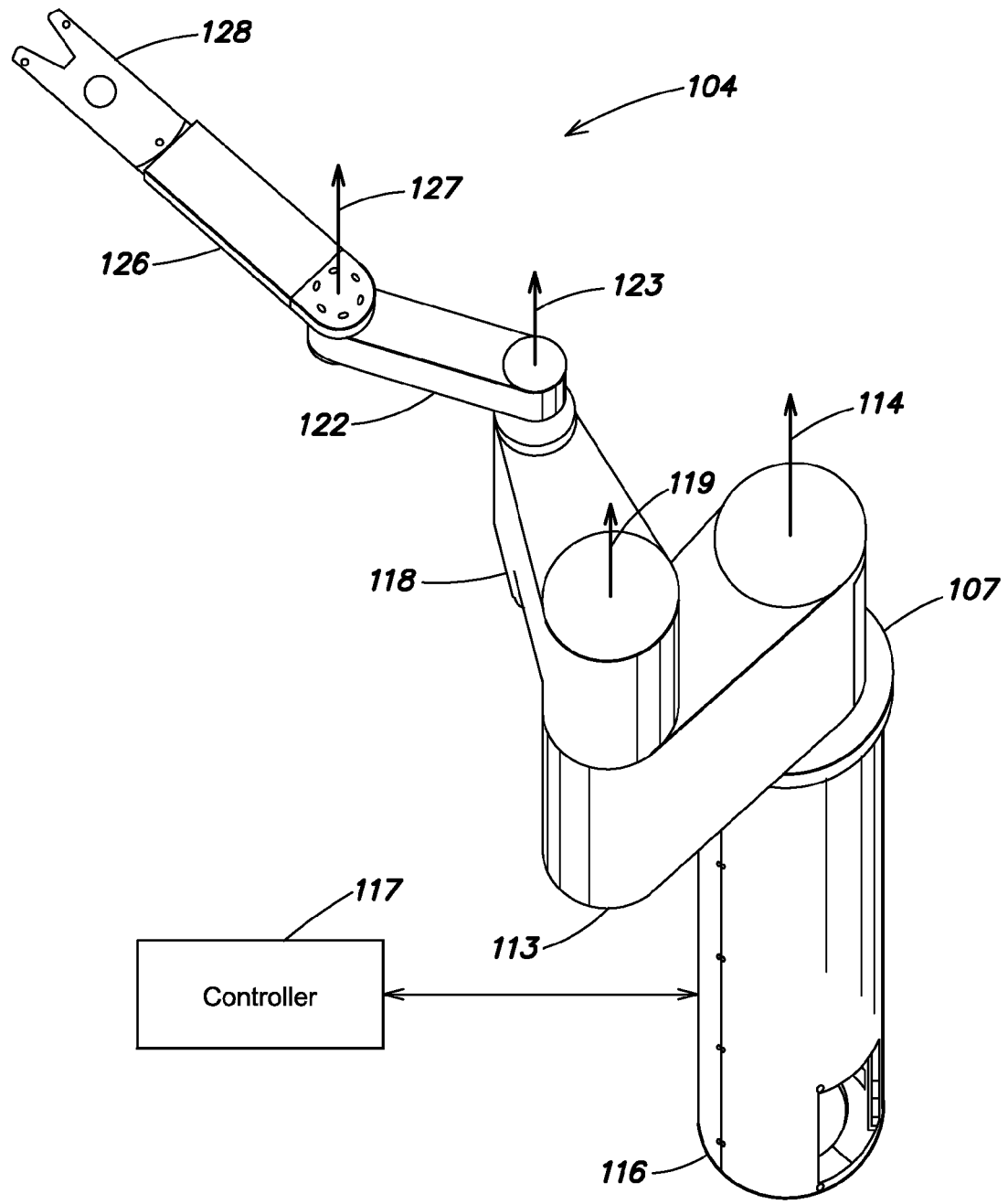
FIG. 2A is an isometric view of a robot apparatus including a single blade according to embodiments.
Figure 2E:
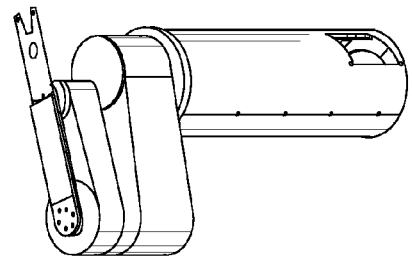
FIGS. 2B-2H are isometric views of an embodiment of the robot apparatus of FIG. 2A shown in various enabled configurations according to embodiments.
Figure 2C:
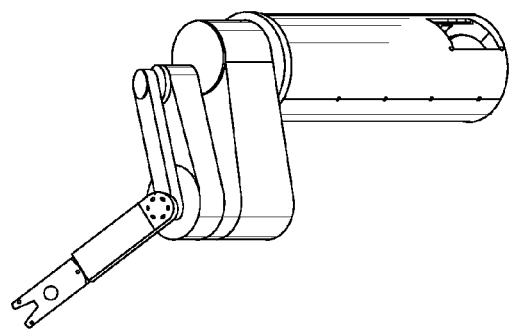
Figure 2D:
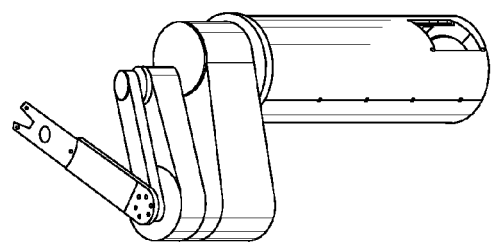
Figure 2B:
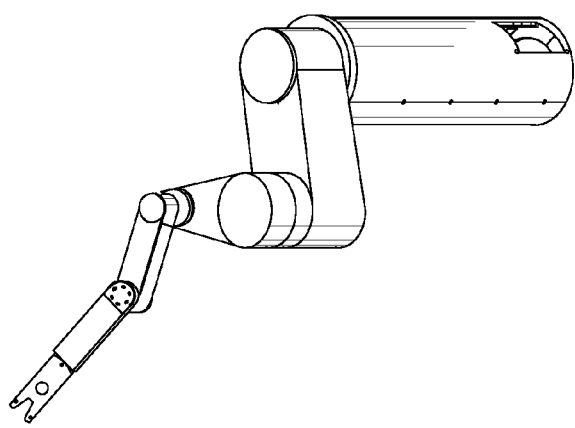
Figure 2H:
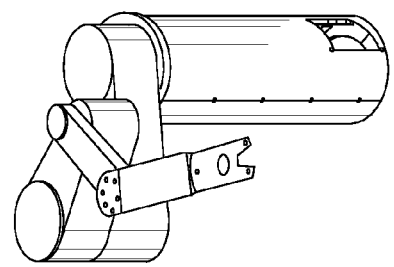
Figure 2G:
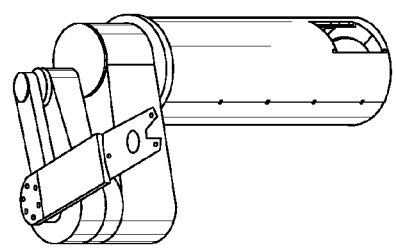
Figure 2F:
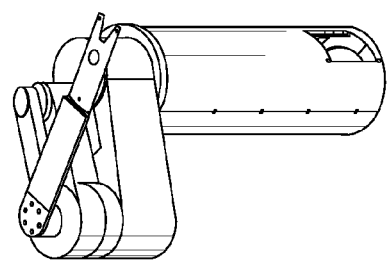
Figure 21:
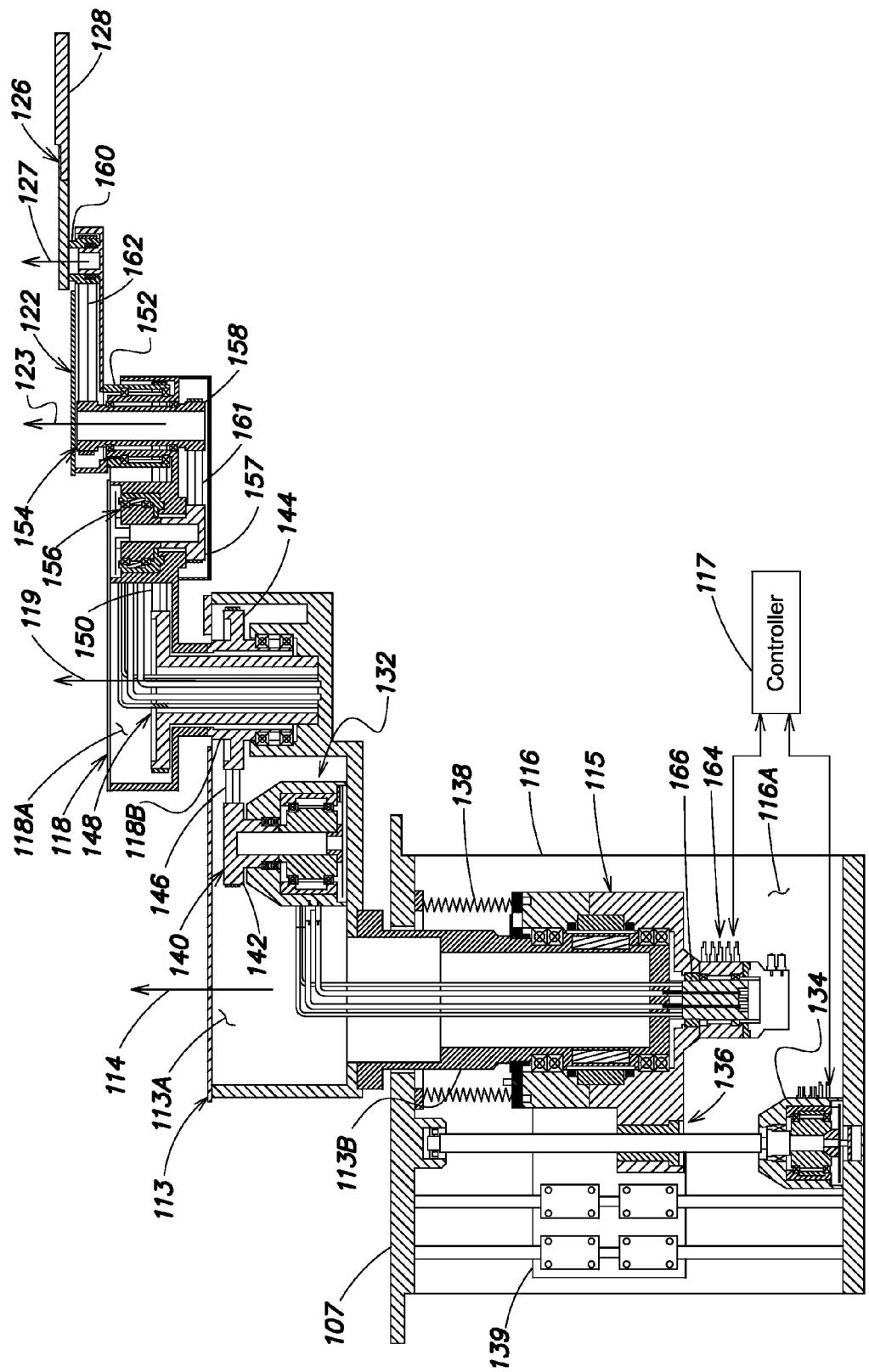

Electronic device manufacturing may require very precise and rapid transport of substrates between various locations. In particular, end effector apparatus may be attached at an end of an arm of a robot apparatus and may be adapted to transport substrates resting upon the end effector to and from process chambers and/or load locks of a substrate processing system. When the arms are long, rigidity of the robot mechanism may be a concern in that rapid starts and stops of the robot apparatus may cause vibration of the end effector. Conventional selective compliance arm robot apparatus (SCARA) type robots may only enter and exit transfer chambers in a straight-on fashion, thereby limiting their versatility. In some systems, especially mainframes having a large number of facets (e.g., 5 or more) and multiple load-locks (such as shown in FIG. 1), the transfer chamber is desired to be made as small as possible, in order to reduce cost and system size. Such size reductions may also minimize the distance that substrates need to move between process chambers and load locks. However, packaging the robot apparatus in a small space envelope represents a significant challenge for existing robots.

In order to reduce the size of the robot and enable servicing of cluster tools having multiple process chambers, the present invention, in a first aspect, provides a robot apparatus having a compact configuration and minimal number of components including a boom coupled with an independent upper arm and wrist member motion capability. Embodiments including independently rotatable upper arm and independently rotatable wrist members having attached single blade and dual blades are described. This configuration enables the overall size envelope of the robot to be reduced, and allows entry into chambers and load locks in a non straight-on orientation, i.e., non-normal to the process chamber facet. Moreover, by kinematically coupling the motions of the upper arm link housing and the forearm link housing, construction may be simplified.

In one aspect, an electronic device processing system is provided that includes a robot apparatus that may be used for transporting substrates between chambers in electronic device manufacturing. The electronic device processing system includes a chamber and a robot apparatus received in the chamber. The robot apparatus includes a boom linkage, an upper arm link housing, and a wrist member, the wrist member adapted to couple to an end effector, wherein the end effector is adapted to carry a substrate. A forearm drive member is provided that rigidly couples to the boom linkage and has a forearm driving element extending through the upper arm link housing, the forearm driving element being coupled to a driven member of the forearm link housing. In this manner, the forearm link housing may be kinematically driven through independent rotation of the upper arm linkage relative to the boom linkage. Additionally, independent rotation of the upper arm link housing and the wrist member may be provided. Independent rotation of the upper arm link housing relative to the boom linkage may be provided by a motor mounted in the boom linkage. Independent rotation of the wrist member relative to the forearm link housing may be provided by a motor mounted in the upper arm link housing.

Further details of exemplary embodiments of various aspects of the invention are described with reference to FIGS. 1-6 herein.

FIG. 1 is a top view schematic diagram of an exemplary embodiment of an electronic device processing system 100 according to the present invention. The electronic device processing system 100 may be adapted to transfer substrates between process chambers, for example. The electronic device processing system 100 includes a housing 101 including a transfer chamber 102. The transfer chamber 102 includes top, bottom and side walls and may be maintained in a vacuum, for example. A robot apparatus 104 is received in the transfer chamber 102 and is adapted to be operable therein. The robot apparatus 104 may be adapted to pick or place a substrate 105 (sometimes referred to as a "wafer" or "semiconductor wafer") mounted on an end effector 128 of the robot apparatus 104 to or from a destination. The destination may be a chamber coupled to the transfer chamber 102. For example, the destination may be one or more process chambers 106 and/or one or more load lock chambers 108 that may be coupled to the transfer chamber 102.

Process chambers 106 may be adapted to carry out any number of process steps on the substrates 105, such as deposition, oxidation, nitration, etching, polishing, cleaning, lithography, or the like. The load lock chambers 108 may be adapted to interface with a factory interface 109, that may receive substrates 105 from substrate carriers 111 (e.g., Front Opening Unified Pods (FOUPs)) docked at load ports of the factory interface 109. Another robot (not shown) may be used to transfer substrates 105 between the substrate carriers 111 and the load locks 108 as shown by arrows 112. Transfers may be carried out in any sequence or order.

Now referring in more detail to FIGS. 2A-2I, the robot apparatus 104 is described in more detail. The robot apparatus 104 may include a base 107 adapted to be attached to a wall of the transfer chamber 102, a boom linkage 113, which, in the depicted embodiment, is a substantially rigid cantilever beam. The boom linkage 113 may be adapted to be rotated about a first rotational axis 114 in either a clockwise or counterclockwise rotational direction. The rotation about first rotational axis 114 may be provided by any suitable motive member, such as first motor 115 that may be received in a motor housing 116, such as a conventional variable reluctance or permanent magnet electric motor. The rotation of the boom linkage 113 may be controlled by suitable commands to the first motor 115 from a controller 117.

Mounted at an outboard end of the boom linkage 113, at a position spaced from the first rotational axis 114, is an upper arm link housing 118. In operation, once the boom linkage 113 is positioned adjacent to the desired destination for a pick or place of a substrate 105, the upper arm housing 118 may be suitably actuated, along with a forearm link housing 122, and wrist member 126 to pick or place a substrate 105 on the blade 128 to or from the destination (e.g., a process chamber 106 or load lock chamber 108).

Again referring to FIGS. 2A-2I, a first embodiment of the robot apparatus 104 that may be adapted to be used in the substrate processing system 100 of FIG. 1 is described. As discussed above, the robot apparatus 104 may include a base 107, a boom linkage 113 rotatable relative to the base 107, an upper arm link housing 118 coupled to the boom linkage 113 at a first radial position offset from the first rotational axis 114. The upper arm link housing 118 may be adapted to be rotated in an X-Y plane relative to the boom linkage 113 about a second rotational axis 119 at the first radial position.

Coupled to the upper arm link housing 118 at a second position spaced from the second rotational axis 119 is a forearm link housing 122. The forearm link housing 122 is adapted for rotation in the X-Y plane relative to the upper arm link housing 118 about a third rotational axis 123 at the second position.

Located on an outboard end of the forearm link housing 122 at a position spaced from the third rotational axis 123 is the wrist member 126. The wrist member 126 is adapted for rotation in the X-Y plane relative to the forearm link housing 122 about a fourth rotational axis 127. Furthermore, the wrist member 126 is adapted to couple to an end effector 128 (otherwise referred to as a "blade"), wherein the end effector 128 is adapted to carry and transport a substrate 105 (FIG. 1) during pick and place operations. The end effector 128 may be of any suitable construction. The end effector 128 may be passive or may include some active means for holding the substrate such as a mechanical clamp or electrostatic capability. The end effector may be coupled to the wrist member by any suitable means such as mechanical fastening, adhering, clamping, etc. Optionally, the wrist member and end effector may be coupled to each other by being formed as one integral piece.

In the depicted embodiment of FIG. 1, the robot apparatus 104 is shown located and housed in a transfer chamber 102. However, it should be recognized that this embodiment of robot apparatus 104, as well as the other robot apparatus described herein, may advantageously be used in other areas of electronic device manufacturing, such as in a factory interface 138 wherein the robot apparatus may transport substrates 105 or substrate carriers 111 between load ports and load lock chambers 108 of the processing system, for example. The robot apparatus described herein (e.g., apparatus 100) are also capable of other transporting uses.

FIGS. 2B-2H illustrate various positional capabilities of the present invention robotic apparatus 100. In each, as will be apparent following the descriptions of FIG. 2I below, the boom linkage 113 may be independently rotated relative to the base. Likewise, the wrist member 126 (and coupled end effector 128) may be independently rotated relative to the forearm link housing 122. Similarly, the upper arm link housing 118 may be independently rotated relative to the boom linkage 113. As will become apparent, the forearm link housing 122 is kinematically driven by the motion of the upper arm link housing 118.

FIG. 2I illustrates a cross sectioned side view of the robot apparatus 104 shown fully extended condition for ease of illustration. The robot apparatus 104 in this embodiment may include a base 107 that may include a flange or other attachment features adapted to attach to a wall of a chamber (e.g., a transfer chamber 102) or other frame member, for example. The base 107 may be coupled to, or integral with, a motor housing 116 that contains a first motor 115. The first motor 115 is adapted to rotate the boom linkage 113 about the first rotational axis 114. The boom linkage 113 may be a rigid cantilever beam that may extend outwardly from the first rotational axis 114 in a radial direction. The boom linkage 113 may include a cavity 113A adapted to receive a second motor 132 to be more fully described below. The boom linkage 113 may also include a pilot shaft 113B that extends into the motor housing 116 and that includes the rotor of the first motor 115 mounted thereon.

The robot apparatus 104 may further include a vertical motor 134 and a vertical drive mechanism 136 that is adapted to cause vertical motion (in the Z axis) of the end effector 128. The vertical drive mechanism 136 may include a worm drive, lead screw, or rack and pinion mechanism that when rotated by the vertical motor 134 causes the first motor 115 to translate vertically along the first rotational axis 114. A bellows 138 or other suitable vacuum barrier may be used to accommodate the vertical motion and also act as a vacuum barrier between the vacuum chamber and the inside 116A of the motor housing 116 that may be at atmospheric pressure. One or more translation-accommodating devices 139, such as linear bearings or other linear motion restraining means may be used to restrain the motion of the first motor 115 to vertical motion only along the first rotational axis 114.

The robot apparatus 104 may include an upper arm link housing 118 rotationally coupled to the boom linkage 113 at a first radial position offset from the first rotational axis 114 and rotatable about the second rotational axis 119. In this embodiment, the upper arm link housing 118 includes a cavity 118A and a pilot shaft 118B. The pilot shaft 118B is rotationally mounted in the boom linkage 113 by one or more suitable bearings. The pilot shaft 118B of the upper arm link housing 118 is also coupled to a second motor 132 mounted to the boom linkage 113. The coupling to the second motor 132 may be by an upper arm drive assembly 140. The upper arm drive assembly 140 may comprise any suitable structure for driving the pilot shaft 118B. For example, in the depicted embodiment, the upper arm drive assembly 140 may include a drive member 142, a driven member 144 coupled to the pilot shaft 118B, and an upper arm drive element 146 connected between the drive member 142 and driven member 144. The drive member 142 may be a pulley coupled to the rotor of the second motor 132, and the driven member 144 may be a pulley on the pilot shaft 118B. The upper arm drive element 146 may be one or more belts or straps, such as two conventional metal straps wherein each belt is rigidly coupled to the pulleys at its end. In the depicted embodiment, the second motor 132 that is housed in the cavity 113A of the boom linkage 113 may be exposed to a vacuum.

The robot apparatus 104 also includes a forearm drive member 148 that is rigidly coupled to the boom linkage 113, such as at a lower end of the boom linkage. The forearm drive member 148 may include a shaft fixedly received or attached to the boom linkage 113, and a pulley at an upper end thereof. The forearm drive member 148 may be coupled to a forearm drive element 150 extending through the cavity 118A of the upper arm link housing 118. The forearm drive element 150 may be coupled to a forearm driven member 152 of the forearm link housing 122. The forearm driven member 152 may be a pilot shaft extending downwardly from the body of the forearm link housing 122. The pilot shaft may be mounted for rotation in the upper arm link housing 118 by one or more suitable bearings.

A wrist drive assembly 154 may be included and adapted to allow the wrist member 126 to be independently rotated about the fourth rotational axis 127 relative to the forearm link housing 122. The wrist drive assembly 154 may include a third motor 156 mounted in the upper arm link housing 118, a wrist drive member 157, a transfer shaft 158 rotationally mounted by bearings in the upper arm link housing 118, a wrist driven member 160, and first and second drive elements 161, 162. Transfer shaft 158 is coupled to the wrist drive member 157 at its lower end and the wrist driven member 160 at its upper end by first wrist driving element 161 and second wrist driving elements 162, respectively. The transfer shaft may include suitable pulleys at its upper and lower ends. The wrist driving elements 161, 162 may be one or more belts or straps, such as two conventional metal straps wherein each belt is rigidly coupled to the connected pulleys at its end. In the depicted embodiment, the third motor 156, like the second motor 132, is housed in a cavity 118A and may be exposed to a vacuum. Each of the respective second and third motors 132, 156 may be variable reluctance or permanent magnet electric motors, for example. They may each include feedback sensors to provide precise feedback of positional information to the controller 117. Conductors may pass through the various cavities 118A, 113A and connect to a connector assembly 164. The connector assembly 164 may be any suitable connector such as a slip ring assembly, having a plurality of brush connections as are known to those of skill in the art. Proximate to the connector assembly 164 may be any suitable vacuum seal device 166, such as a ferro-fluid seal as are known to those of skill in the art. The vacuum seal allows atmospheric conditions to be present in the motor housing 116A and vacuum conditions to be present in the cavity 113A and inside of the pilot shaft 113B.

In operation, control signals from the controller 117 to the third motor 156 cause rotation of the rotor relative to the stator thereof. This causes rotation of the wrist drive member 157 and resultant rotation of the transfer shaft 158 and wrist driven member 160, thus causing independent rotation of the wrist member 126 and the coupled end effector 128 relative to the forearm link housing 122. Likewise, control signals from the controller 117 to the second motor 132 cause rotation of the rotor relative to the stator thereof. This causes rotation of the upper arm drive member 142 and resultant rotation of the upper arm driven member 144, thus causing rotation of the upper arm link housing 118 relative to the boom linkage 113. Thus, it should be apparent that the upper arm link housing 118 and the wrist member 126 rotation about the second rotational axis 119 and the fourth rotational axis 127 in the X-Y plane may be independently accomplished. Thus, advantageously, an infinite number of transfer paths of the end effector 128 may be accomplished by the robot apparatus 104.

Figure 3:
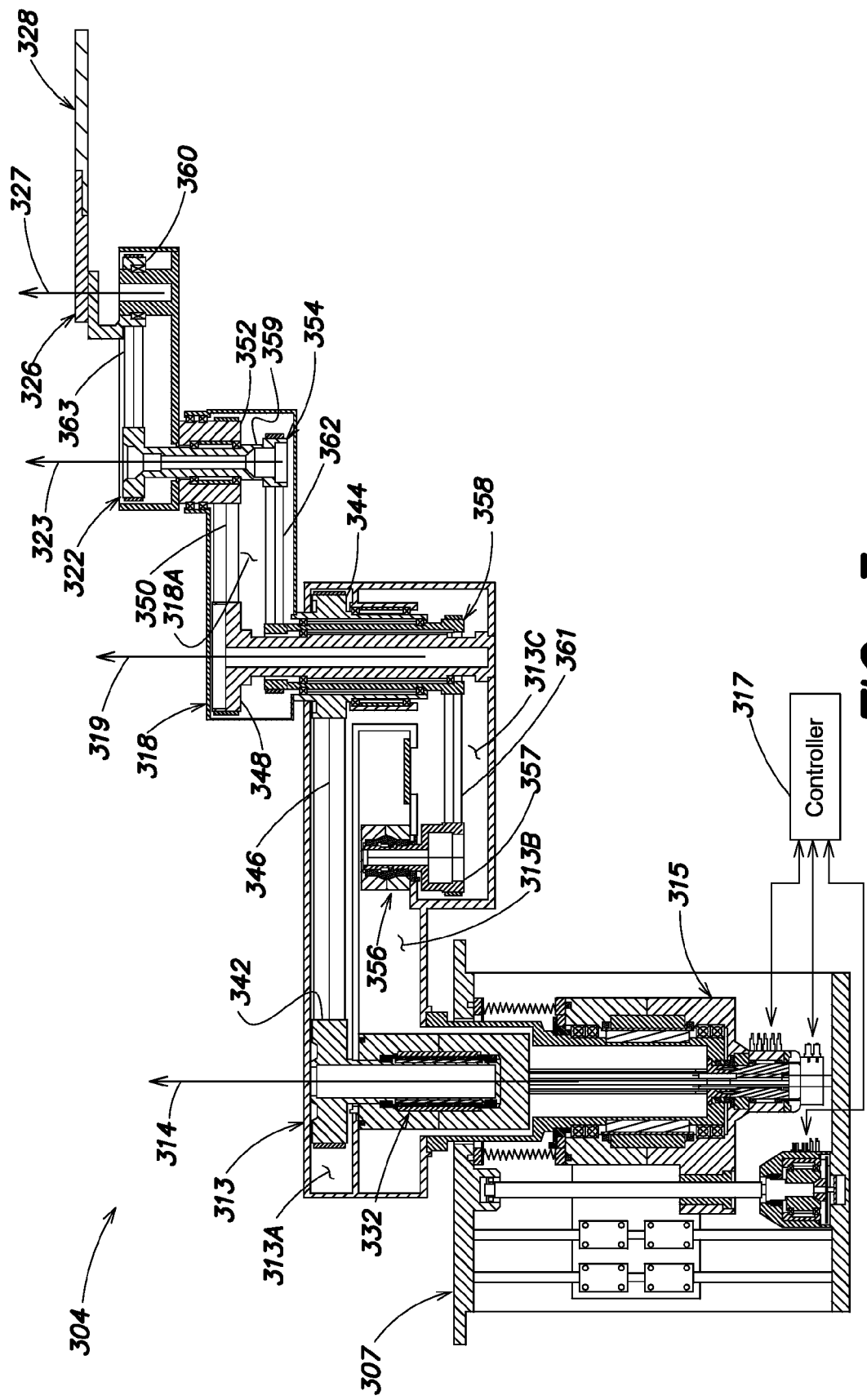
FIG. 3 is a cross sectioned side view of an alternative embodiment of robot apparatus.

FIG. 3 illustrates an alternate embodiment of a robot apparatus 304 that may be adapted for use within an electronic device processing system 100. The robot apparatus 304 in this embodiment may include all the same components as in the previous embodiment, such as a base 307, a boom linkage 313 adapted for rotation about a first rotational axis 314 in an X-Y plane, an upper arm link housing 318 adapted for rotation about a second rotational axis 319 in the X-Y plane, a forearm link housing 322 adapted for rotation about a third rotational axis 323 in the X-Y plane, and a wrist member 326 adapted for rotation in the X-Y plane about a fourth rotational axis 327. An end effector 328 may be coupled to the wrist member 326 and adapted to hold a substrate (not shown). The end effectors 328 may be attached to the wrist members 326 as a separate member or may be formed as an integral unit with the wrist member 326. Similarly, the robot apparatus 304 may also include a first motor 315 adapted to rotate the boom link 313, a second motor 332 adapted to independently rotate the upper arm link housing 318, and a third motor 356 adapted to provide independent rotation of the wrist member 326 relative to the forearm link housing 322. In comparison to the previous embodiment, both of the second and third motors 332, 356 are mounted on the boom linkage 313. Thus, in this embodiment, each of the three motors 315, 332, and 356 may be mounted in atmosphere. In particular, the boom linkage 313 may include three chambers 313A, 313B, and 3131C. Chambers 313A and 313C may be provided with a vacuum, whereas chamber 313B may be provided at atmospheric pressure.

In operation, the upper arm link housing 318 may be independently driven relative to the boom linkage 313 by the second motor 332. The second motor 332 includes a stator fixedly mounted to the boom linkage 313 and a rotor mounted to an upper arm drive member 342. In operation, rotation of the upper arm drive member 342 by the second motor 332 causes an upper arm driven member 344 coupled to the upper arm link housing 318 to rotate about the second axis 319 in the X-Y plane. A drive element 346, which may be any suitable drive connector such as a belt, drive shaft, etc. may connect between the upper arm drive member 342 and upper arm driven member 344. In some embodiments, the drive element 346 is comprised of metal straps each connected (e.g., pinned) to the upper arm drive member 342 and upper arm driven member 344. In this embodiment, the wrist member 326, and, thus, the end effector 328 may be independently rotated relative to the forearm link housing 322 about a fourth axis 327. In this embodiment, the wrist member 326 is driven by a wrist drive assembly 354, which is comprised of a wrist drive member 357, a wrist driven member 360, first and second transfer shafts 358, 359 and wrist driving elements 361, 362, 363. This arrangement allows the independent rotation of the upper arm link housing 318 relative to the boom linkage 313 and also the independent rotation of the wrist member 326 relative to the forearm link housing 322, yet allows the first motor 332 and the second motor 356 to be located in atmosphere. This advantageously limits particle generation within the vacuum chamber that the robot apparatus 304 is received within. Suitable seals (e.g., ferro-fluid seals) may be provided between the shafts of first and second motors 332, 356 and their respective motor housings to seal the pressure interface between atmospheric and vacuum conditions.

As in the previous embodiment, a forearm drive member 348 is provided in a fixed relationship (i.e., rigidly coupled) to the boom linkage 313. The forearm drive member 348 may include a shaft affixed at a lower end to a bottom portion of the boom linkage 313, for example. The forearm drive member 348 may include a pulley at an upper end thereof. The forearm drive member 348 may be coupled to a forearm drive element 350 extending through the cavity 318A of the upper arm link housing 318. The forearm drive element 350 may be coupled to a forearm driven member 352 of the forearm link housing 322. The forearm driven member 152 may be a pilot shaft extending downwardly from the body of the forearm link housing 322. The pilot shaft may be mounted for rotation in the upper arm link housing 318 by one or more suitable bearings, such as ball bearings. Other suitable bearings and/or bearing assemblies may be provided at each rotational axis.

It should be apparent that the motion of the upper arm link housing 318 and the forearm link housing 322 are kinematically linked in the depicted embodiment. When the upper arm link housing 318 is rotated by way of a suitable control signal to the first motor 332 by controller 317, the forearm link housing 322 rotates an amount dictated by the resultant gear ratios determined by the diameters of the forearm drive member 348 and forearm driven member 352. In the dictated embodiment, the ratio of angular rotations of the forearm drive member 348 to the forearm driven member 352 may be approximately 1:1. Other ratios may be used.

Figure 4A:
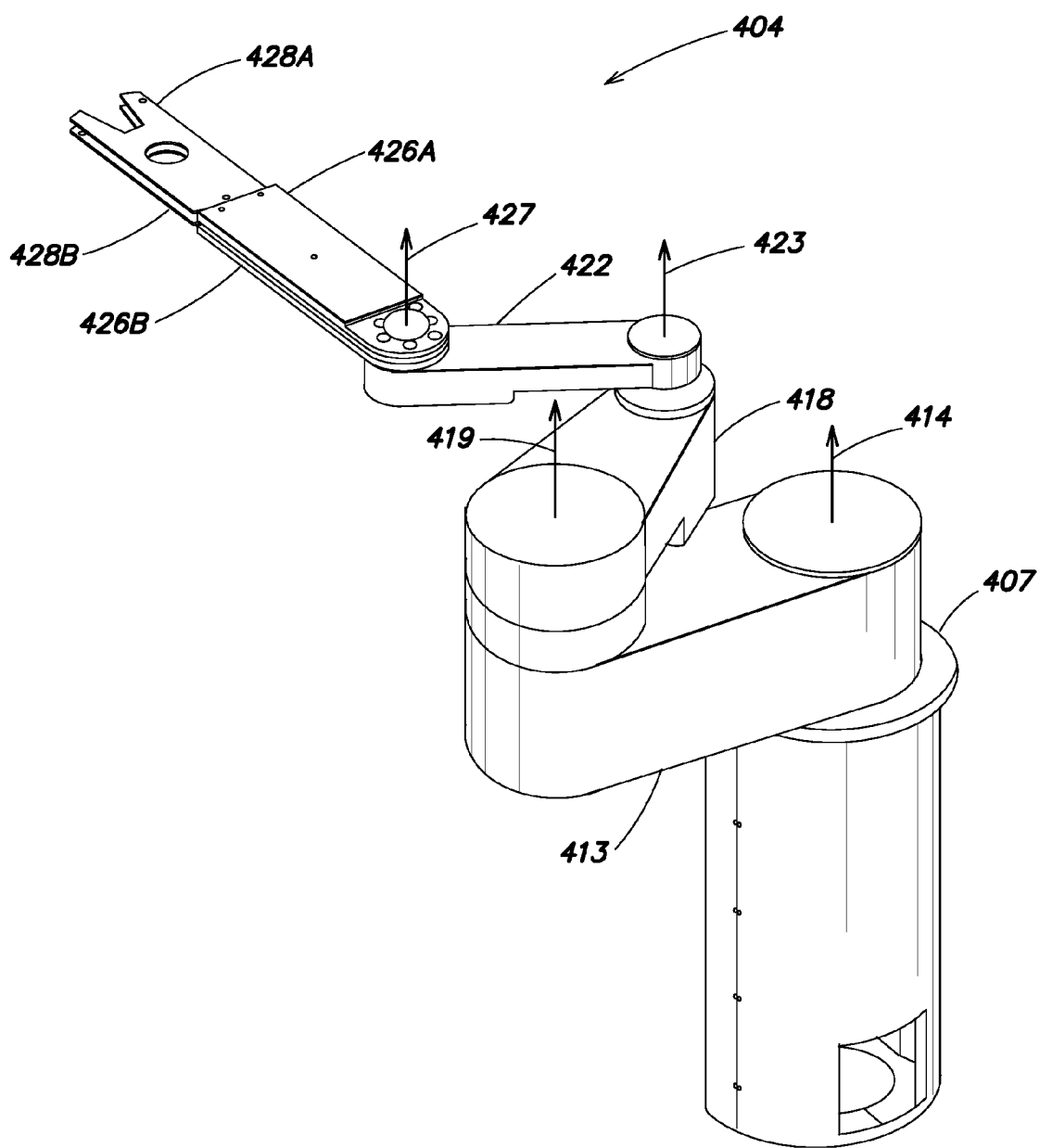
FIG. 4A is an isometric view of a dual-blade robot apparatus according to embodiments.
Figure 4B:
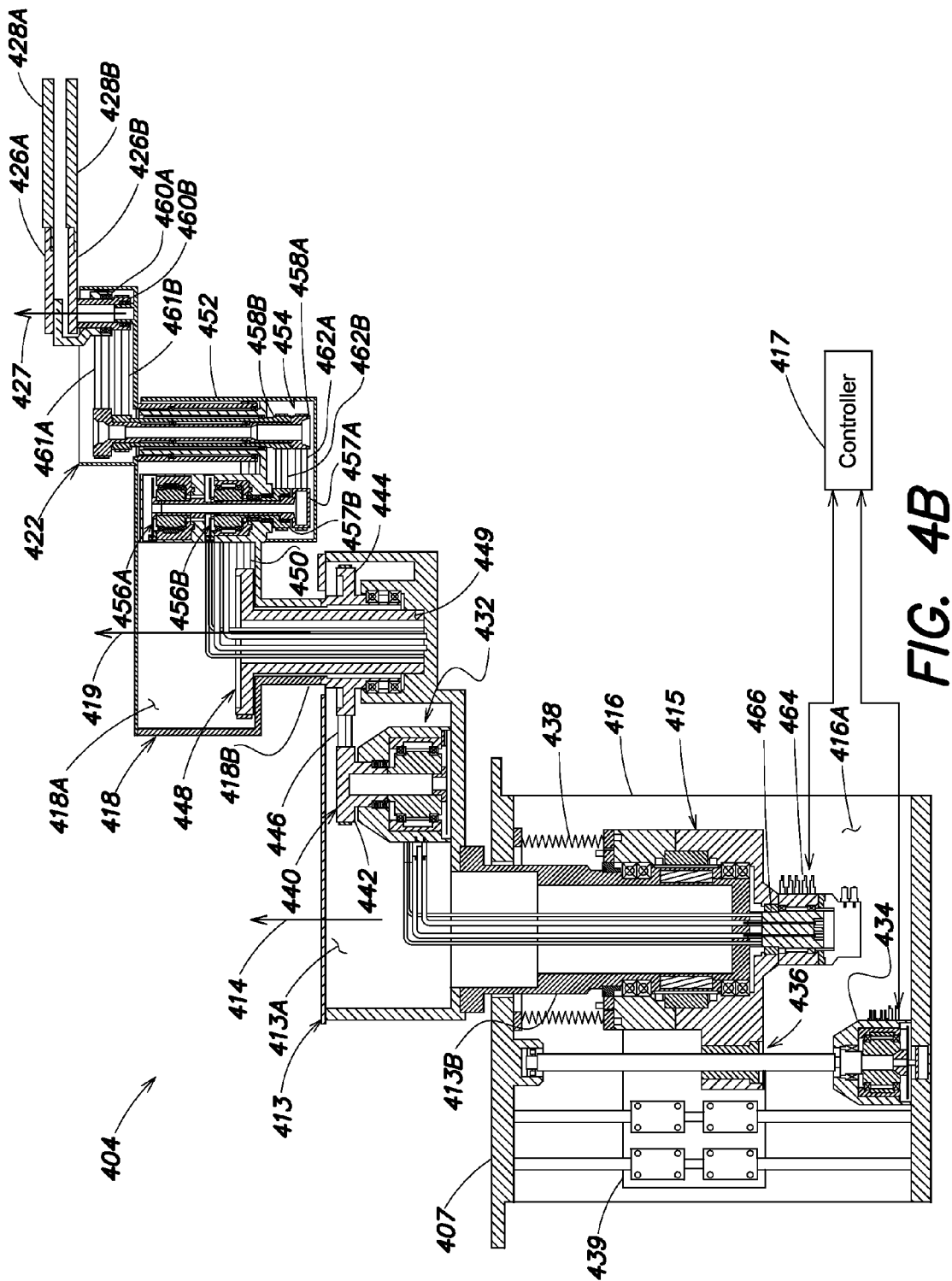
FIG. 4B is a cross sectioned side view of an embodiment of a dual-blade robot apparatus.
Figure 4F:
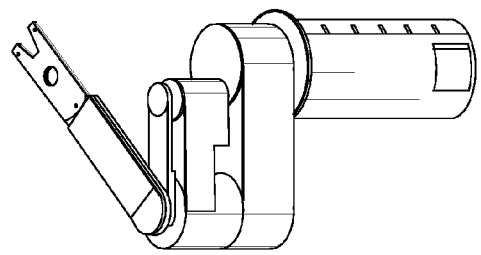
FIGS. 4C-4I are isometric views of an embodiment of dual-blade robot apparatus of FIG. 4A shown in various enabled orientations.
Figure 4D:
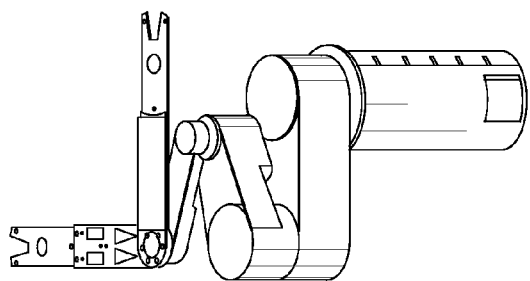
Figure 4E:
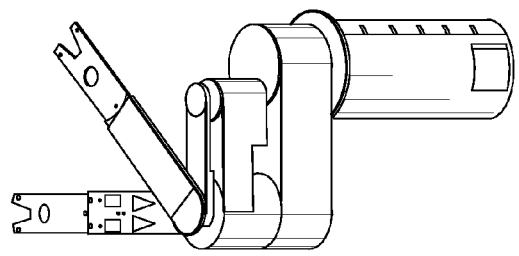
Figure 4C:
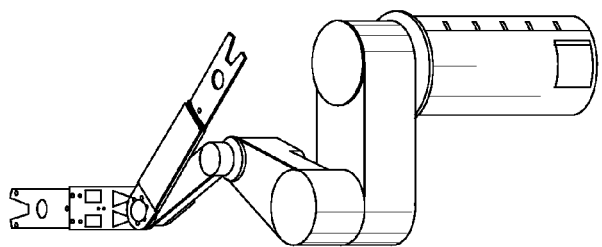
Figure 4H:
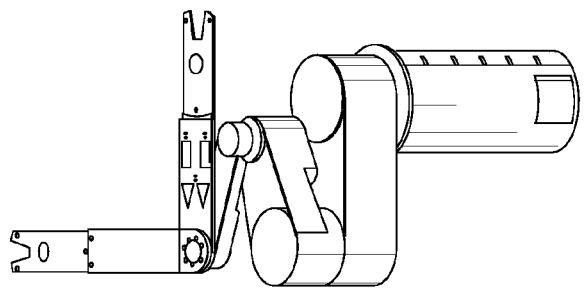
Figure 4I:
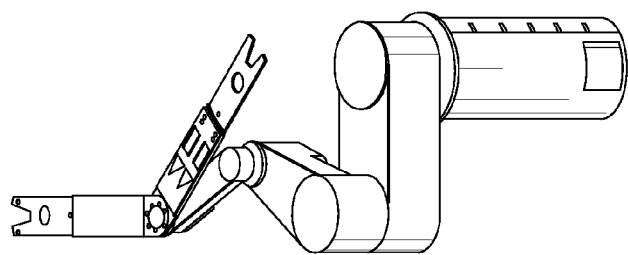
Figure 4G:
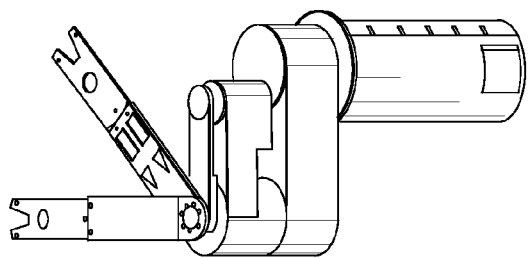

FIGS. 4A-4B illustrate another embodiment of a robot apparatus 404 that may be adapted for use within an electronic device processing system 100. This robot apparatus 404 comprises dual end effectors (e.g., blades) that may be position one atop the other. This configuration allows for the exchange of two substrates at a particular process chamber while keeping the robot apparatus locally oriented near the chamber. Accordingly, throughput may be increased.

The robot apparatus 404 in this embodiment may include a base 407 adapted to be attached to a wall of a chamber, such as a wall of a transfer chamber for example, and a boom linkage 413. The boom linkage 413 may be adapted for rotation about the first rotational axis 414 relative to the base 407. The robot apparatus 404 may also include an upper arm link housing 418 adapted for independent rotation about a second rotational axis 419 in the X-Y plane relative to the boom linkage 413, and a forearm link housing 422 adapted for rotation about a third rotational axis 423 in the X-Y plane. In this embodiment, multiple wrist members 426A, 426B are provided one over top of the other wherein each is adapted for independent rotation in the X-Y plane about a fourth rotational axis 427. End effectors 428A, 428B may be coupled to the wrist members 426A, 426B and adapted to hold a substrate (not shown). The end effectors 428A, 428B may be attached to the wrist members 426A, 426B as a separate member or may be formed as an integral unit with the wrist members 426A, 426B.

As best shown in FIG. 4B, the robot apparatus 404 includes a boom linkage 413 that may be independently rotated relative to the base 417 by actuation of a first motor 415. Likewise, the wrist members 426A, 426B (and coupled end effectors 428A, 428B) may be independently rotated relative to the forearm link housing 422. Similarly, the upper arm link housing 418 may be independently rotated relative to the boom linkage 413. As in the previous embodiment, the forearm link housing 422 is kinematically driven by the motion of the upper arm link housing 418.

FIG. 4B illustrates a cross sectioned side view of the robot apparatus 404 shown in a fully extended condition for ease of illustration. The robot apparatus 404 in this embodiment may include a base 407 coupled to, or integral with, a motor housing 416 that contains a first motor 415. The first motor 415 is adapted to rotate the boom linkage 413 about the first rotational axis 414. The boom linkage 413 may be a rigid cantilever beam that may extend outwardly from the first rotational axis 414 in a radial direction. The boom linkage 413 may include a cavity 413A adapted to receive a second motor 432 to be more fully described below. The boom linkage 413 may also include a pilot shaft 413B that extends into the motor housing 416 and that includes the rotor of the first motor 415 mounted thereto.

The robot apparatus 404 may further include a vertical motor 434 and a vertical drive mechanism 436 that is adapted to cause vertical motion (in the Z axis) of the end effectors 428A, 428B. The vertical drive mechanism 436 may include a worm drive or lead screw that, when rotated by the vertical motor 434, causes the first motor 415 to translate vertically along the first rotational axis 414. A bellows 438 or other suitable vacuum barrier may be used to accommodate the vertical motion and also act as a vacuum barrier between the vacuum chamber, in which the boom linkage 413, upper arm link housing, forearm link housing, and wrist member 422 is located, and the inside 416A of the motor housing 416 that may be at atmospheric pressure. One or more translation-accommodating devices 439, such as linear bearings or other linear motion accommodating means may be used to restrain the radial and rotational motion of the stator of the first motor 415 such that the motion of the stator is restricted to vertical motion only along the first rotational axis 414.

The robot apparatus 404 may include an upper arm link housing 418 rotationally coupled to the boom linkage 413 at a first radial position offset from the first rotational axis 414 and rotatable about the second rotational axis 419. In this embodiment, the upper arm link housing 418 includes a cavity 418A and a pilot shaft 418B. The pilot shaft 418B is rotationally mounted in the boom linkage 413 by one or more suitable bearings, such as ball bearings. The pilot shaft 418B of the upper arm link housing 418 is also coupled to a second motor 432 mounted to the boom linkage 413. The coupling to the second motor 432 may be by an upper arm drive assembly 440. The upper arm drive assembly 440 may comprise any suitable structure for driving the pilot shaft 418B. For example, in the depicted embodiment, the upper arm drive assembly 440 may include a drive member 442, a driven member 444 coupled to the pilot shaft 418B, and an upper arm drive element 446 connected between the drive member 442 and driven member 444. The drive member 442 may be a pulley coupled to the rotor of the second motor 432, and the driven member 444 may be a pulley on the pilot shaft 418B. The upper arm drive element 446 may be one or more belts or straps, such as two conventional metal straps wherein each belt is rigidly coupled to the pulleys at its end. In the depicted embodiment, the second motor 432 that is housed in the cavity 413A of the boom linkage 113 may be exposed to a vacuum.

The robot apparatus 404 also includes a forearm drive member 448 that is rigidly coupled to the boom linkage 413, such as at a lower end of the boom linkage 413. The forearm drive member 448 may include a shaft 449 fixedly received or attached to the boom linkage 413, such as in a pocket thereof. The forearm drive member 448 may include a pulley at an upper end thereof. The forearm drive member 448 may be coupled to a forearm drive element 450 extending through the cavity 418A of the upper arm link housing 418. The forearm drive element 450 may be coupled to a forearm driven member 452 of the forearm link housing 422. The forearm driven member 452 may be a pilot shaft extending downwardly from the body of the forearm link housing 422. The pilot shaft may be mounted for rotation in the upper arm link housing 418 by one or more suitable bearings or the like.

A wrist drive assembly 454 may be included and adapted to allow each of the wrist members 426A, 426B to be independently rotated about the fourth rotational axis 427 relative to the forearm link housing 422. The wrist drive assembly 454 may include third and fourth motors 456A, 456B mounted in the upper arm link housing 418, wrist drive members 457A, 457B, transfer shafts 158A, 158B rotationally mounted by bearings to the upper arm link housing 418, wrist driven members 460A, 460B, and first drive elements 461A, 461B and second drive elements 462A, 462B. Transfer shafts 458A, 458B are coupled to the wrist drive members 457A, 457B at their lower ends and the wrist driven member 460A, 460B at their upper ends by first wrist driving element 461A, 461B and second wrist driving elements 462A, 462B, respectively. The transfer shafts 458A, 458B may include suitable pulleys at their upper and lower ends. The wrist driving elements 461A, 461B, 462A, 462B may be one or more belts or straps, such as two conventional metal straps wherein each belt is rigidly coupled to the connected pulleys at its end. In the depicted embodiment, the third and fourth motors 456A, 456B are housed in the cavity 418A and may be exposed to a vacuum. Each of the respective motors 432, 456A, and 456B may be variable reluctance or permanent magnet electric motors, for example. Other types of motors may be used. They may each include a feedback sensor to provide precise feedback of positional information to the controller 417. Conductors may pass through the various cavities 418A, 413A and connect to a connector assembly 464. The connector assembly 464 may be any suitable connector such as a slip ring assembly, having a plurality of brush connections as are known to those of skill in the art. Proximate to the connector assembly 464 may be any suitable vacuum seal device 466, such as a ferro-fluid seal as are known to those of skill in the art. The vacuum seal allows atmospheric conditions to be present in the motor housing 416A and vacuum conditions to be present in the cavity 413A and inside of the pilot shaft 413B.

In operation, control signals from the controller 417 to the third and fourth motors 456A, 456B cause respective rotation of the rotors relative to the stators thereof. This causes rotation of the wrist drive members 457A, 457B and resultant rotation of the transfer shafts 458A, 458B and wrist driven member 460A, 460B, thus causing independent rotation of the wrist members 426A, 426B and the coupled end effector 428A, 428B relative to the forearm link housing 422. In this manner, substrates may be exchanges at a process chamber without having to move the robot to a second location as in the single wrist version.

The controller 417 may also provide control signals to the second motor 432 to cause rotation of the rotor relative to the stator thereof. This causes rotation of the upper arm drive member 444 and resultant rotation of the upper arm driven member 446, thus causing rotation of the upper arm link housing 418 relative to the boom linkage 413. Thus, it should be apparent that the upper arm link housing 418 and the wrist members 426A, 426B rotation about the second rotational axis 419 and the fourth rotational axis 427 in the X-Y plane may be independently accomplished. Thus, advantageously, an infinite number of transfer paths of the end effector 128 may be accomplished by the robot apparatus 404 in the X-Y plane. Various configurations of the dual-bladed robot apparatus 404 are shown in FIG. 4C-4I. As can be seen, the boom linkage 413 may be rotated to any desired orientation, then independent rotation of the upper arm link housing 418 may be accomplished along with independent rotation of the wrist members 426A, 426B to bring about a substrate swap at a process chamber. Kinematic coupling between the upper arm boom linkage 422 and forearm link housing 418 simplifies the overall structure and minimizes the number of motors needed.

Figure 5:
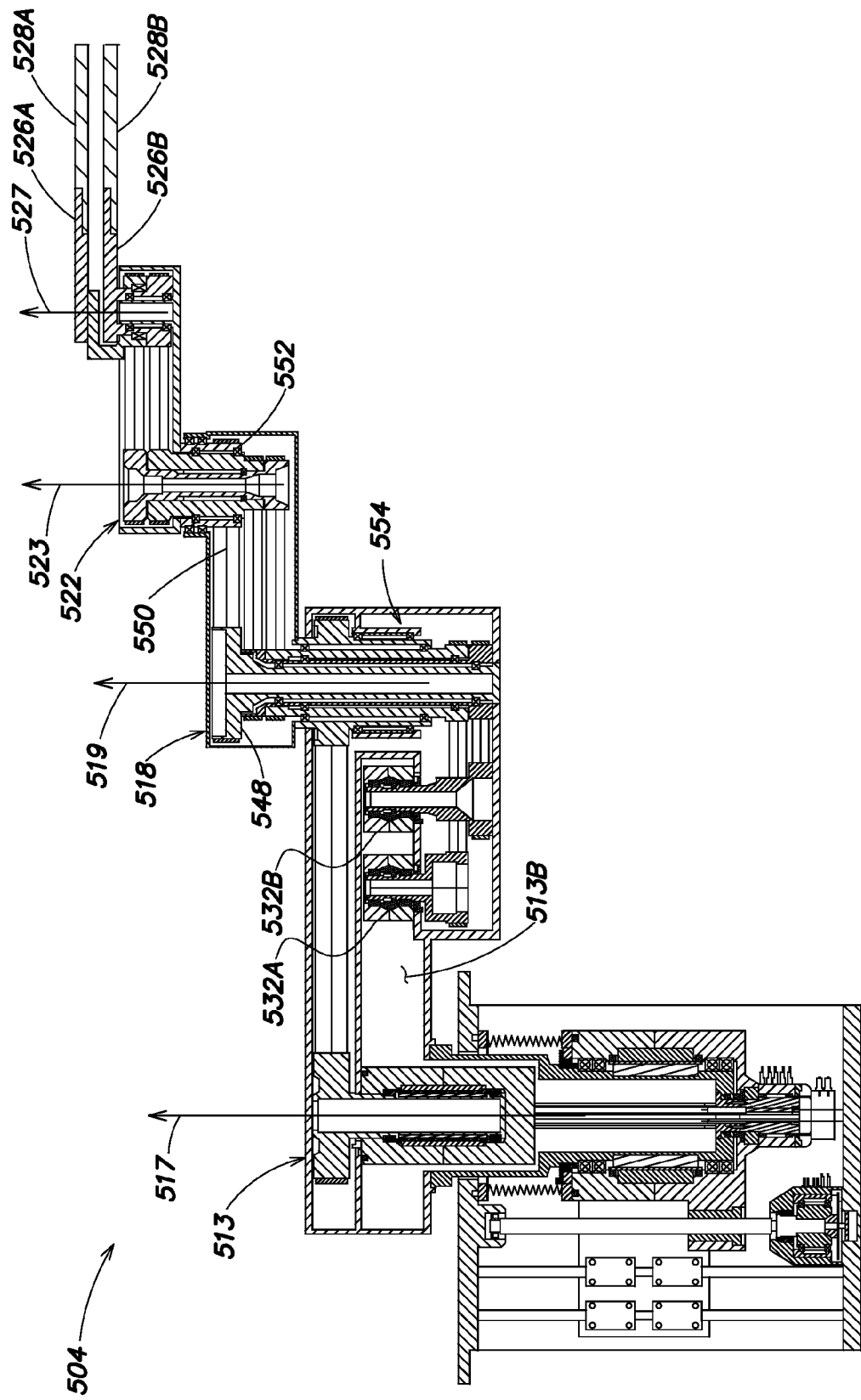
FIG. 5 is a cross sectioned side view of an alternative dual-blade robot apparatus according to embodiments.

FIG. 5 illustrates yet another embodiment of robot apparatus 504 including independently controllable wrist members 526A, 526B. This embodiment is, in most aspects, the same as the FIG. 3 embodiment. The robot apparatus 504 may be received in a chamber and adapted to transport a substrate (not shown). The robot apparatus includes a boom linkage 513 adapted to rotate about a first rotational axis 517, an upper arm link housing 518 coupled to the boom linkage 513 at a first radial position offset from the first rotational axis 517, the upper arm link housing adapted to rotate about a second rotational axis 519 at the first radial position, a forearm link housing 522 coupled to the upper arm link housing 518 at a second position spaced from the second rotational axis 519, and adapted for rotation relative to the upper arm link housing 518 about a third rotational axis 523 at the second position, and the multiple wrist members 526A, 526B coupled to, and adapted for rotation relative to the forearm link housing 522 about a fourth rotational axis 527. The wrist members are adapted to couple to end effectors 528A, 528B, wherein the end effectors are adapted to carry substrates (not shown). As in the FIG. 3 embodiment, a forearm drive member 548 is rigidly coupled to the boom linkage 513, a forearm driving element 550 extends through the upper arm link housing 518, and the forearm driving element 550 is coupled to a driven member 552 of the forearm link housing 522.

The main difference between the FIG. 5 and FIG. 3 embodiments is that there are two motors 532A, 532B mounted and housed in the boom linkage 513 in the FIG. 5 embodiment. Like the FIG. 3 embodiment, the motors 532A, 532B reside in a cavity 513B containing approximately atmospheric pressure whereas the wrist drive assembly 554 is exposed to a vacuum.

Figure 6:
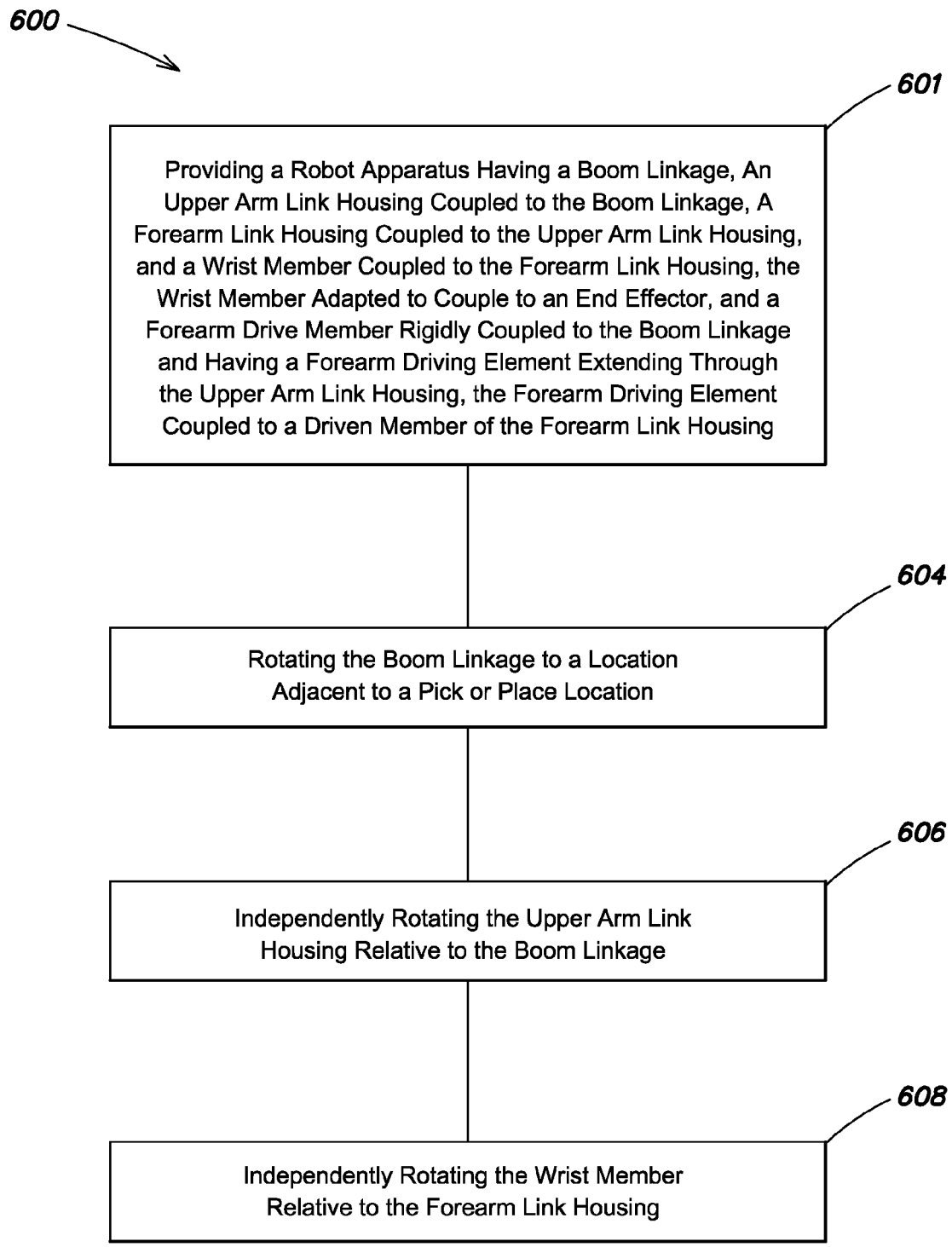
FIG. 6 is a flowchart depicting a method of operating a robot apparatus according to another aspect of the present invention.

A method 600 of transporting a substrate within an electronic device processing system according to the present invention is provided and described with reference to FIG. 6. The method 600 includes providing a robot apparatus (e.g., 104, 304, 404, 504) having a boom linkage (e.g., 113, 313, 413, 513), an upper arm link housing (e.g., 118, 318, 418, 518) coupled to the boom linkage, a forearm link housing (e.g., 122, 322, 422, 522) coupled to the upper arm link housing, and a wrist member (e.g., 126, 326, 426A, 426B, 526A, 526B) coupled to the forearm link housing, the wrist member adapted to couple to an end effector (e.g., 128, 328, 428A, 428B, 528A, 528B), and a forearm drive member (e.g., 148, 348, 548) rigidly coupled to the boom linkage and having a forearm driving element (e.g., 150, 350, 550) extending through the upper arm link housing, the forearm driving element being coupled to a driven member (e.g., 152, 352, 552) of the forearm link housing. In block 604, the boom linkage (e.g., 113, 313, 413, 513) is rotated to a location adjacent to a delivery destination (e.g., a pick or place location). In block 606, the upper arm link housing is independently rotated relative to the boom linkage. The independent rotation may be in the clockwise or counterclockwise direction and initiated by signals from the controller (e.g., 117, 317, 417, 517) to the first motor (e.g., 115, 315, 415). Similarly, in block 608, independent rotation of the wrist member (e.g., 126, 326, 426A, 426B, 526A, 526B) is accomplished by rotation of the wrist member relative to the forearm link housing (e.g., 122, 322, 422, 522).

As should be apparent, using the robot apparatus as described herein, a put and a pick of a substrate may be accomplished at a destination location and the overall size of the robot apparatus, and thus the chamber housing the robot apparatus may be reduced. In some embodiments, the boom linkage, upper arm link housing, and wrist members may be rotated in synchronism to assist in a put or pick operation. In each of the aforementioned embodiments, the motion of the upper arm link housing (e.g., 118, 318, 418, and 518) and the forearm link housing (122, 322, 422, 522) are kinematically linked. That is, they are geared together by the drive member (e.g., 148, 348, 448, 548), driven member (e.g., 152, 352, 452, 552), and forearm drive element (e.g., 150, 350, 450, 550).

The foregoing description discloses only exemplary embodiments of the invention. Modifications of the above-disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. An electronic device processing system, comprising:
   a chamber;
   a robot apparatus received in the chamber and adapted to transport a substrate, the robot apparatus including
   a boom linkage adapted to rotate about a first rotational axis and including a cavity;
   an upper arm link housing including a pilot shaft coupled to the boom linkage at a first radial position offset from the first rotational axis, the upper arm link housing adapted to rotate about a second rotational axis at the first radial position;
   a forearm link housing coupled to the upper arm link housing at a second position spaced from the second rotational axis, and adapted for rotation relative to the upper arm link housing about a third rotational axis at the second position;
   a wrist member coupled to, and adapted for rotation relative to the forearm link housing about a fourth rotational axis, the wrist member adapted to couple to an end effector, wherein the end effector is adapted to carry a substrate; and
   a forearm drive member rigidly coupled and fixedly attached to the boom linkage and having a forearm driving element extending through the upper arm link housing, the forearm driving element coupled to a driven member of the forearm link housing, wherein the forearm drive member is a shaft with a pulley at one end and the shaft cannot move relative to the boom linkage;
   an upper arm drive motor mounted to the boom linkage;
   an upper arm drive assembly coupled to the upper arm drive motor and including a drive member, a driven member coupled to the pilot shaft, and an upper arm drive element coupled between the drive member and the driven member, wherein the drive member, the driven member, and the upper arm drive element are all housed in the cavity of the boom linkage; and a wrist member drive assembly comprising a wrist drive member, a transfer shaft pivotally mounted to the upper arm link housing, a wrist driven member on the wrist member, and first and second wrist driving elements coupled between the transfer shaft and the wrist drive member and transfer shaft and wrist driven member, respectively.

2. The system of claim 1 wherein the boom linkage is driven by a first motor in a motor housing.

3. The system of claim 1 wherein the forearm drive member extends through the pilot shaft of the upper arm link housing.

4. The system of claim 3 wherein the pilot shaft of the upper arm link housing is coupled to the upper arm drive motor mounted to the boom linkage.

5. The system of claim 4 wherein the upper arm drive motor housed in the boom linkage is exposed to a vacuum.

6. The system of claim 1 comprising the upper arm drive motor and a wrist drive motor housed in the the boom linkage.

7. The system of claim 6 wherein the upper arm drive motor and the wrist drive motor housed in the boom linkage are exposed to atmosphere whereas the wrist member drive assembly is exposed to vacuum.

8. The system of claim 6 wherein the wrist drive motor housed in the boom linkage is adapted to cause a rotation of the wrist member.

9. A robot apparatus, comprising:
a boom linkage and including a cavity, the boom linkage adapted to rotate about a first rotational axis;
an upper arm link housing including a pilot shaft coupled to the boom linkage at a first radial position offset from the first rotational axis, the upper arm link housing adapted to rotate about a second rotational axis at the first radial position;
a forearm link housing coupled to the upper arm link housing at a second position spaced from the second rotational axis, and adapted for rotation relative to the upper arm about a third rotational axis at the second position;
a wrist member coupled to, and adapted for rotation relative to the forearm link housing about a fourth rotational axis, the wrist member adapted to couple to an end effector, wherein the end effector is adapted to carry a substrate; and
a forearm drive member rigidly coupled and fixedly attached to the boom linkage and having a forearm driving element extending through the upper arm link housing, the forearm driving element coupled to a driven member of the forearm link housing, wherein the forearm drive member is a shaft with a pulley at one end and the shaft cannot move relative to the boom linkage;
an upper arm drive motor mounted to the boom linkage;
an upper arm drive assembly coupled to the upper arm drive motor and including a drive member, a driven member coupled to the pilot shaft, and an upper arm drive element coupled between the drive member and the driven member, wherein the drive member, the driven member, and the upper arm drive element are all housed in the cavity of the boom linkage; and a wrist member drive assembly comprising a wrist drive member, a transfer shaft pivotally mounted to the upper arm link housing, a wrist driven member on the wrist member, and first and second wrist driving elements coupled between the transfer shaft and the wrist drive member and transfer shaft and wrist driven member, respectively.

10. The apparatus of claim 9 wherein the boom linkage is driven by a first motor in a motor housing.

11. The apparatus of claim 9 wherein the forearm drive member extends through a pilot shaft of the upper arm link housing.

12. The apparatus of claim 11 comprising a third motor housed in the upper arm link housing adapted to cause a rotation of the wrist member.

13. The robot apparatus of claim 9, comprising a wrist drive motor coupled to the wrist drive member wherein the wrist drive motor is mounted on the boom linkage.

14. A method of transporting a substrate within an electronic device processing system, comprising:
providing a robot apparatus having a boom linkage including a cavity, an upper arm link including a pilot shaft housing coupled to the boom linkage, a forearm link housing coupled to the upper arm link housing, and a wrist member coupled to the forearm link housing, the wrist member adapted to couple to an end effector, and a forearm drive member rigidly coupled and fixedly attached to the boom linkage and having a forearm driving element extending through the upper arm link housing, the forearm driving element coupled to a driven member of the forearm link housing, wherein the forearm drive member is a shaft with a pulley at one end and the shaft cannot move relative to the boom linkage, an upper arm drive motor mounted to the boom linkage;
an upper arm drive assembly coupled to an upper arm drive motor, and including a drive member, a driven member coupled to the pilot shaft, and an upper arm drive element coupled between the drive member and the driven member, wherein the drive member, the driven member, and the upper arm drive element are all housed in the cavity of the boom linkage; and
a wrist member drive assembly comprising a wrist drive member, a transfer shaft pivotally mounted to the upper arm link housing, a wrist driven member on the wrist member, and first and second wrist driving elements coupled between the transfer shaft and the wrist drive member and transfer shaft and wrist driven member, respectively;
rotating the boom linkage to a location adjacent to a pick or place location;
independently rotating the upper arm link housing relative to the boom linkage; and
independently rotating the wrist member relative to the forearm link housing.

* * * * *